United States Patent [19]

Akamatsu et al.

[11] Patent Number: 4,967,105
[45] Date of Patent: Oct. 30, 1990

[54] LOAD CURRENT CONTROL-TYPE LOGIC CIRCUIT

[75] Inventors: Norio Akamatsu, 9-3, 4-chome Sumiyoshi-cho, Tokushima-shi; Toshiya Tsukao, Nara, both of Japan

[73] Assignees: Sharp Kabushiki Kaisha; Norio Akamatsu, both of Osaka, Japan

[21] Appl. No.: 358,072

[22] Filed: May 30, 1989

[30] Foreign Application Priority Data

May 30, 1988 [JP] Japan ................................. 63-133798

[51] Int. Cl.$^5$ ................ H03K 19/017; H03K 19/094; H03K 19/084; H03K 19/20

[52] U.S. Cl. .................................... 307/448; 307/450; 307/475; 307/544

[58] Field of Search ............... 307/443, 448, 450, 475, 307/471, 542, 544, 571, 446

[56] References Cited

U.S. PATENT DOCUMENTS

| | | | |
|---|---|---|---|
| 4,177,390 | 12/1979 | Cappon | 307/450 |
| 4,703,204 | 10/1987 | Pham | 307/448 |
| 4,725,743 | 2/1988 | Anderson | 307/448 X |
| 4,760,293 | 7/1988 | Hebenstreit | 307/544 X |
| 4,771,189 | 9/1988 | Noufer | 307/448 |
| 4,788,460 | 11/1988 | Kobatake | 307/448 X |
| 4,789,798 | 12/1988 | Lach | 307/450 X |
| 4,800,303 | 1/1989 | Graham et al. | 307/544 X |
| 4,835,423 | 5/1989 | De Ferron et al. | 307/448 X |
| 4,877,976 | 10/1989 | Lach et al. | 307/448 X |

FOREIGN PATENT DOCUMENTS 63-56016   3/1988   Japan ................................. 307/448

Primary Examiner—Stanley D. Miller
Assistant Examiner—David R. Bertelson

[57] ABSTRACT

An inverter portion, which is to be basic logic circuit, includes switching FETs corresponding to input terminals and a load FET. A logic signal inputted into each of the input terminals drives each corresponding switching FET, thereby to output a prescribed logic signal from an output terminal. Further, a load for restricting a current flowing in the load FET is connected between the gate and the source of the load FET. In addition, a load current control FET is provided for controlling the current in this load. A gate potential of the load current control FET is produced by a diode OR circuit. The diode OR circuit outputs a logic OR of the logic signals inputted into the respective input terminals, and supplies it to the gate of the load current control FET as a load current control signal.

14 Claims, 3 Drawing Sheets

LOAD CURRENT CONTROL-TYPE LOGIC CIRCUIT

BACKGROUND OF THE INVENTION

Field of the Invention

The present invention relates to a load current control-type logic circuit, and more particularly to a load current control-type logic circuit of multiple inputs.

DESCRIPTION OF THE BACKGROUND ART

In a logic circuit in general, it is extremely difficult to achieve both an increased operation speed and decreased power consumption simultaneously in that both are incompatible. When silicon is used as a material for logic circuit elements in order to reduce power consumption, a complementary logic circuit is formed by employing a P channel transistor and an N channel transistor. Further, to achieve a high operation speed and low power consumption in the logic circuit, a compound semiconductor such as gallium arsenide need be used. However, the logic circuit employing gallium arsenide has not been as well developed as has a logic circuit employing silicon.

The reason for this is described as follows.

(1) Since a standard deviation in a tolerance of a threshold voltage by ion implantation is extremely small, a production yield is low in manufacturing an integrated circuit.

(2) In the logic circuit employing gallium arsenide, the transition speed of a logic is low when a P channel field effect transistor is employed. Therefore, it is difficult to achieve a high speed operation and low power consumption by forming a complementary logic circuit.

(3) It is also difficult to implement a reliable large-scale integrated circuit because a logic amplitude of a logic circuit employing gallium arsenide is in the vicinity of one volt. Thus, it is susceptible to noises.

To eliminate the foregoing disadvantages, the present applicant has proposed in advance an improved logic circuit. The logic circuit is a load current control-type logic circuit having a large logic amplitude, high speed operation, and low power consumption. FIG. 1 illustrates the configuration of an inverter circuit of the load current control-type logic circuit provided by the applicant. The load current control-type circuit shown in FIG. 1 is formed to control an electric current of a load element according to an input state. The configuration and operation of the load current control-type logic circuit shown in FIG. 1 will now be described.

A basic logic circuit is an inverter circuit. A basic inverter circuit employing a field effect transistor (hereinafter referred to as a FET) is a DCFL (direct coupled FET logic). An inverter portion in the load current control-type logic circuit of FIG. 1 includes, as in case of the DCFL, an enhancement-type switching FET 1 having its gate provided with a signal IN, and a depletion-type load FET 2. The load FET 2 has its gate and source short-circuited in the DCFL; however a load current control portion including a load current control FET 3 and a load 4 is added to the inverter portion in the circuit of FIG. 1. A level shifting circuit 7 is provided, if necessary, to regulate a voltage applied to the gate of the load current control FET 3.

The operation of the load current control-type logic circuit shown in FIG. 1 will now be described. When the signal IN of a logical low (an L level) is inputted into an input terminal a, the switching FET I is turned off, and a logic signal OUT of a logical high (an H level) is outputted at an output terminal b. At this time, the load current control FET 3 is also turned off, so that a potential between the source and the gate of the load FET 2 falls to 0V, and the operation of the circuit is the same as a common DCFL.

When the signal IN of the logic H level is then inputted to the input terminal a, the switching FET 1 is turned on. At this time, the load current control FET 3 is simultaneously turned on, so that a current path through the load 4 and the load current control FET 3 to a low potential terminal c (a potential=Vpd1) is provided. Accordingly, when an inverter at the succeeding stage is connected to the output terminal b, a charge withdrawing path in the gate input portion of the inverter at the succeeding stage is set up by the load 4 and the load current control FET 3. Furthermore, since a voltage drop by the load 4 is applied between the source and the gate of the load FET 2, a current flowing in the load FET 2 is restricted. According to the above described operations, the level of the output signal OUT at the output terminal b can rapidly shift from the logic H level to the logic L level. In addition, since the current in the load FET 2 is restricted, even if a width of the gate of the load FET 2 is increased, the power consumption does not increase much and the output logic L level can be sufficiently low. Therefore, the ratio of the width of the gate of the load FET 2 to the switching FET 1 can be set larger than that of the DCFL. Thus, the load current control-type logic circuit can be designed which has a large capability of load driving.

In accordance with the above mentioned operation, the load current control-type logic circuit shown in FIG. 1 is characterized in that it has a larger logic amplitude and a larger load driving capability. Further, it is less susceptible to diversification in characteristics of elements than the DCFL. Meanwhile, the load current control-type logic circuit of FIG. 1 is an E, D-type logic circuit as well as the common DCFL, so that power consumption thereof is essentially low.

FIG. 2 is a circuit diagram illustrating a two-input NOR circuit formed by employing the load current control-type logic circuit shown in FIG. 1. Referring to FIG. 2, switching FETs 11 and 12 are provided in parallel, the number of which corresponds to the number of input signals. Further, load current control FETs 31 and 32 are also provided in parallel, the number of which corresponds to that of the input. Still further, switching FETs 11 and 12 have their gates connected to input terminals a1 and a2, respectively. Level shifting circuits 71 and 72 are required in FIG. 2 when the logic circuit of this figure is formed of such an element with a small built-in potential and a low threshold voltage, such as a JFET (a junction field effect transistor) or a MESFET (a metal semiconductor field effect transistor).

Circuits shown in FIGS. 3A and 3B are commonly used as the level shifting circuits 71 and 72 in FIG. 2. The level shifting circuits shown in FIGS. 3A and 3B employ a forward current rising voltage of a diode and are formed of two elements, namely a diode 5 and a resistor 61, or the diode 5 and a pull-down transistor 62.

In the configuration of the NOR circuit of multiple inputs shown in FIG. 2, a total of four elements, i.e. three transistors (or, two transistors and one resistor) and one diode, need be added as the number of input signals increases by one. Therefore, the number of elements in the multi-input logic circuit largely increases. This means that the circuit has complex interconnections and occupies a large area when implemented in an integrated circuit (IC). When the load current-type logic circuit is employed for a gate array in particular, since a unit cell is formed by the multi-input NOR in many cases, a substantial increase in the number of the elements configured in a multi-input manner prevents high integration.

SUMMARY OF THE INVENTION

It is an object of the present invention to provide a load current control-type logic circuit which requires a minimum number of elements even if configured in a multi-input manner.

The load current control-type logic circuit according to the present invention includes a plurality of input terminals to which logic signals are respectively inputted. A plurality of switching field effect transistors are provided to respectively correspond to the input terminals. A load field effect transistor, a load, a load current control field effect transistor, a plurality of diodes respectively provided corresponding to the input terminals, a pull-down constant current source, and an output terminal are further included. A first low potential is applied to the resective sources of the plurality of switching field effect transistors, and the gates thereof are respectively connected to the corresponding input terminals. A high potential is applied to the drain of the load field effect transistor, and its source is connected to the respective drains of the switching field effect transistors. The load is connected between the gate and the source of the load field effect transistor. A second low potential is applied to the source of the load current control field effect transistor, and the gate of the load field effect transistor is connected to the drain of the load current control field effect transistor. The plurality of diodes have their anodes respectively connected to the corresponding input terminals, and the cathodes connected to the gate of the load current control field effect transistor. The pull-down constant current source is connected to the respective cathodes of the diodes. The output terminal is connected to the respective drains of the switching field effect transistor. In the above described configuration, the outputs of an OR circuit formed of the diodes are supplied as load current control signals to the gate of the load current control field effect transistor.

According to the present invention, since a gate input portion of the load current control FET is constituted by the OR circuit formed of the diodes, the load current control logic circuit of multiple inputs with a minimum number of the elements can be implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First of all, the configuration of one embodiment of the present invention will be described with reference to FIG. 4.

Figure 4:
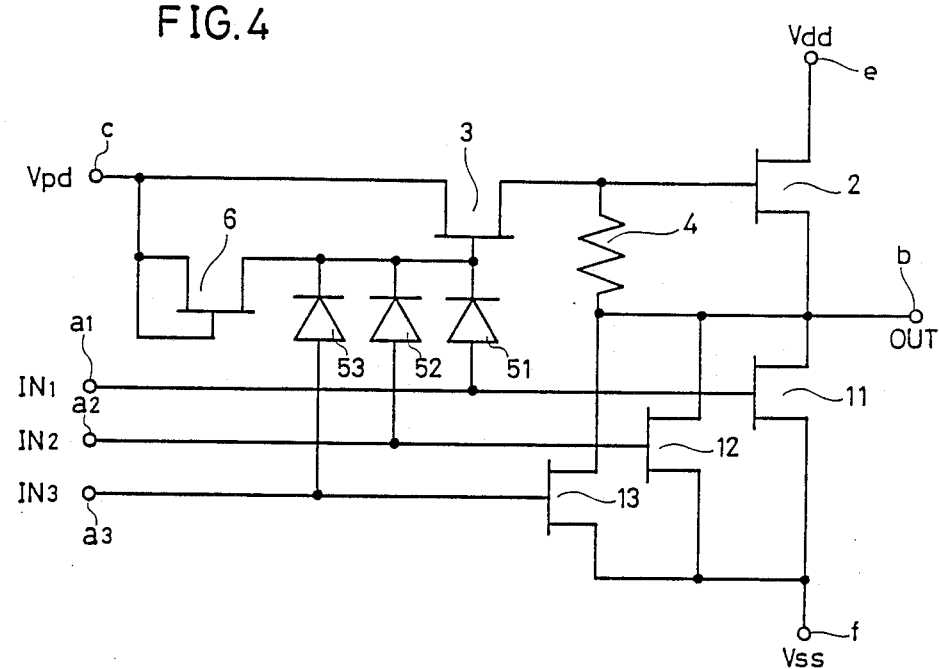
FIG. 4 is a circuit diagram illustrating the configuration of one embodiment of the present invention.

The embodiment of FIG. 4 illustrates a three-input NOR circuit as an example. Logic signals IN1-IN3 are respectively inputted in three input terminals a1-a3. Enhancement-type switching FETs 11-13 are respectively provided corresponding to these three input terminals a1-a3. The switching FETs 11-13 have their respective sources connected to a first low potential terminal f (a low potential=Vss) and their gates respectively connected to the corresponding input terminals a1-a3. Furthermore, the switching FETs 11-13 have their drains commonly connected to an output terminal b and to a high potential terminal e (a high potential=Vdd) via source and drain passes of a depletion-type load FET 2. Also, a load resistor 4 is connected between the gate and the source of the load FET 2. An enhancement-type load current control FET 3 has its source connected to a second low potential terminal c (a low potential=Vpd) and its drain connected to the gate of the load FET 2. Further, the cathodes of diodes 51-53 respectively provided corresponding to the input terminals a1-a3 are commonly connected to the gate of the load current control FET 3. The respective anodes of these diodes 51-53 are connected to their corresponding input terminals a1-a3. In addition, the respective cathodes of the diodes 51-53 are connected to the drain of a depletion-type pull-down FET 6 as a pull-down constant current source. The source and the gate of this pull-down FET 6 are both connected to the second low potential terminal c.

The circuit shown in FIG. 4 is integrated to be formed on a semiconductor substrate. As a material of the semiconductor substrate, silicon may be used, but preferably a compound semiconductor, or most typically a gallium arsenide substrate, is used. In addition, for each FET 2, 3, 6, 11-13 shown in FIG. 4, a JFET (a junction field effect transistor), or most typically a MESFET (a metal semiconductor field effect transistor) is employed.

As has been described, the gate input portion of the load current control FET 3 is constituted by the OR circuit formed of the diodes in the embodiment of FIG. 4. That is, such a circuit configuration is provided that an OR signal of the input signals IN1-IN3 is produced by the diodes 51-53 and then inputted to one load current control FET 3.

Furthermore, in the embodiment of FIG. 4, a power supply Vpd serves both as a negative power supply for load current control and a pull-down power supply of the diode OR circuit. The FET 6 is a pull-down FET for regulating an output current of the OR circuit formed of the diodes 51, 52 and 53. The circuit formed of the diodes 51, 52, 53 and the pull-down FET 6 also serves as a level shifting circuit for lowering DC voltage levels of the input signals IN1, IN2 and IN3.

The following two problems arise resulting from the fact that the gate input portion of the load current control FET 3 is constituted by the OR circuit formed of the diodes.

First, since the diodes are load capacitance for input signals, an operation speed decreases as the number of the input signals increases (an increase in fan-in).

Second, since a current should flow into the diode OR circuit from the input terminals a1, a2 and a3 in order to drive the OR circuit formed of the diodes, the current succeeding stage increases (an increase in fan-out), resulting in fluctuation of a logic level.

However, these problems can be eliminated at the same time by reducing the sizes of the diodes 51, 52 and 53 and of the pull-down FET 6, the capacities to be a load and the current in the diode OR circuit. There also arises a question of when the current in the diode OR circuit decreases, the capability of turning on/off the load current control FET 3, namely a load driving capability is degraded. However, since the size of the load current control FET 3 can be inherently set small, a gate current for turning on/off the load current control FET 3 may flow in a small quantity. Therefore, even if the current in the diode OR circuit decreases, the operation speed of the circuit is not degraded much.

Since the effect which the decreased load capacitance gives the circuit, i.e. the effect to improve degradation in the operation speed and fluctuation of the logic level is more favorable compared to an effect which the decreased current in the diode OR circuit gives the circuit, i.e. the effect to increase degradation in the load driving capability, the above problems are eliminated.

In the embodiment of the FIG. 4, an operation check is carried out by a SPICE simulator so that the following characteristics are obtained.

Parameters employed in the operation check are as follows.

Threshold voltages of the switching FETs 11, 12, 13 and the load current control FET 3 are assumed to be −0.1V, while those of the load FET 2 and the pull-down FET 6 are −0.5V. Further, as for the ratio of the gate width of each FET, when a width of the gate of each of the switching FETs 11, 12, 13 is set to 1, the gate widths of the FET 2, 3 and 6 are respectively 2.0, 0.5 and 0.2. The characteristic of the diodes 51, 52 and 53 is assumed to be a Schottkey characteristic between the gates and the sources of the FETs.

When a ring oscillator is formed so as to check a characteristic in speed versus a change in the fan-in/fan-out, it is understood that as the fan-in increases by one, the speed decreases by 10ps by estimation. The value of 10ps in speed degradation which occurs in this embodiment is not much larger than the value of 8ps in a conventional method. This is an effect caused by reduction in the size of the pull-down FET 6 and the sizes of the diodes 51, 52 and 53. At this time, the decrease in the speed due to the increase in the fan-out is 22ps for an increase by one in the fan-out. Further, a change in an output level due to the increase in the fan-out is suppressed within a noise margin to be 50 mV where the fan-out=5. In the conventional method, the number of current paths increases as the fan-in increases. Thus an increase in power consumption due to the increase in the fan-in can be seen. However, in the load current control-type logic circuit according to the present invention, the number of the pull-down FETs remains the same, so that there is little increase in power consumption according to the increase in the fan-in.

Figure 5:
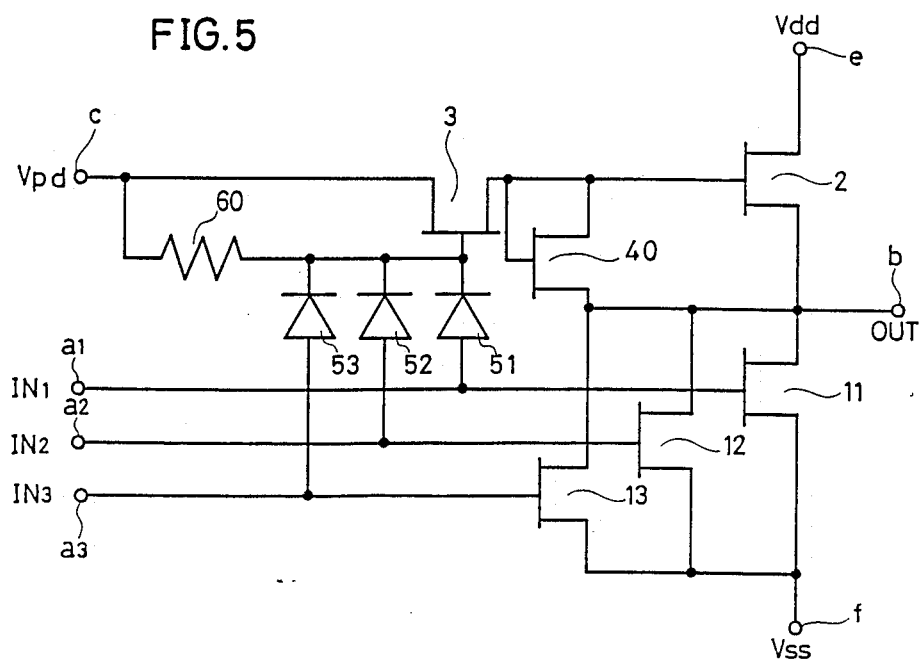
FIG. 5 is a circuit diagram illustrating the configuration of another embodiment of the present invention.

Although the load is formed by employing a resistance element 4 in the embodiment shown in FIG. 4, the load may be formed by employing a FET 40 having its source and gate connected to the gate of the load FET 2 and its drain connected to the source of the load FET 2 as shown in FIG. 5. Moreover, the pull-down constant current source is formed by employing the pull-down FET 6 in the embodiment shown in FIG. 4; however, the pull-down constant current source may be formed by employing a resistance element 60 having one end connected to the respective cathodes of the diodes 51–53 and the other end connected to the second low potential terminal c as shown in FIG. 5.

Finally, a difference between the embodiment shown in FIGS. 4 and 5 and the conventional circuit will be described.

When the load current control-type logic circuit is formed by employing an element which has low built-in potential and is difficult to achieve a high threshold voltage, such as a MESFET, a voltage level shifting circuit should be required for a load current control portion. In this case, if the NOR circuit of multiple inputs is formed in the conventional method, four elements increase as the number of inputs increases by one. On the other hand, as shown in the embodiment in FIG. 4 or 5, if the gate signal input portion of the load current control element 3 is formed of the diode OR circuit, two elements, i.e. a switching element and a diode, can be added as the number of inputs increases by one. Since the diode OR circuit also serves as the voltage level shifting circuit, employment of the diode OR circuit does not result in complexity of the circuit.

Figure 1:
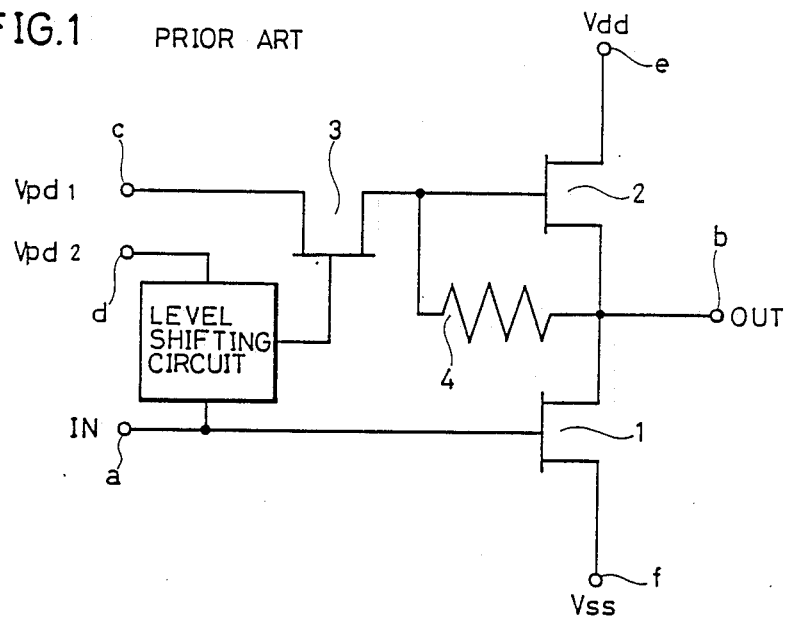
FIG. 1 is a circuit diagram illustrating the configuration of an inverter circuit according to a conventional load current control-type logic circuit.
Figure 2:
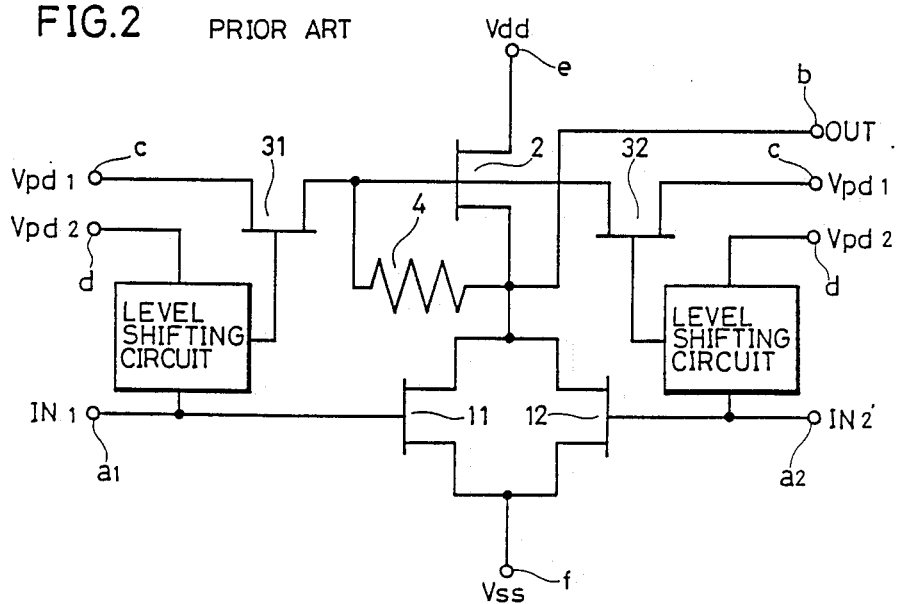
FIG. 2 is a circuit diagram illustrating the configuration of a two-input NOR circuit including the load current control-type logic circuit shown in FIG. 1.
Figure 3A:
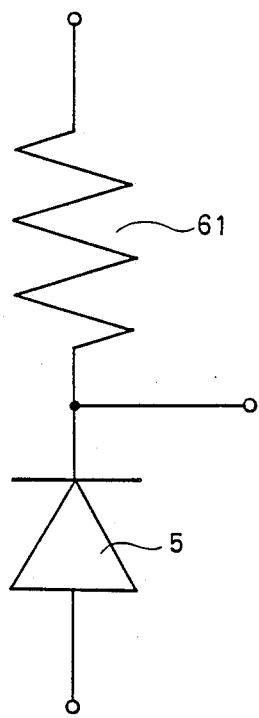
FIGS. 3A and 3B are circuit diagrams illustrating examples of the configuration of the level shifting circuits shown in FIGS. 1 and 2.
Figure 3B:
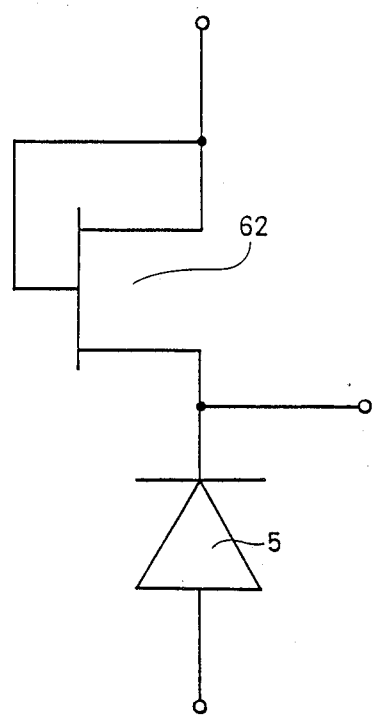

In fact, the one-input inverter formed by employing the diode OR circuit in the load current control portion is the same as the one in the conventional example shown in FIG. 1. However, it differs from the conventional example in the point that the circuit formed of the diodes in the gate input portion of the load current control element 3, is considered as the one which expresses a diode logic, not as a level shifting circuit. Assuming that the load current control-type logic circuit is used as a basic circuit of a gate array, the NOR circuit of multiple inputs can be formed only by preparing in a unit cell with the same number of the switching FETs and the small diodes as that of the inputs, in addition to a pattern of a basic inverter. Accordingly, more simple cells can be achieved than in the conventional example, and an unused space on a gate alley chip can also be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A load current control-type logic circuit comprising:
   a plurality of input terminals to each of which a logic signal is inputted;
   a plurality of switching field effect transistors respectively provided corresponding to said input terminals, each including a source to which a first low potential is applied and a gate respectively connected to said input terminals;
   a load field effect transistor including a drain to which a high potential is applied and a source connected to the respective drains of said switching field effect transistors;
   a load connected between the gate and the source of said load field effect transistor;
   a load current control field effect transistor including a source to which a second low potential is applied and a drain connected to the gate of said load field effect transistor;

a plurality of diodes respectively provided corresponding to said input terminals, each including an anode respectively connected to said input terminals and a cathode connected to the gate of said load current control field effect transistor;

a pull-down constant current source connected to the respective cathodes of said diodes; and an output terminal connected to the respective drains of said switching field effect transistors, whereby an OR output of input signals of said diodes is supplied as a load current control signal to the gate of said load current control field effect transistor.

2. The load current control-type logic circuit of claim 1, wherein said load current control-type logic circuit is integrated to be formed on a semiconductor substrate.

3. The load current control-type logic circuit of claim 2, wherein said semiconductor substrate includes a compound semiconductor.

4. The load current control-type logic circuit of claim 3, wherein said compound semiconductor is gallium arsenide.

5. The load current control-type logic circuit of claim 3, wherein said plurality of switching field effect transistors, said load field effect transistor and said load current control field effect transistor each include a JFET (a junction field effect transistor).

6. The load current control-type logic circuit of claim 5, wherein said JFET is a MESFET (a metal semiconductor field effect transistor).

7. The load current control-type logic circuit of claim 6, wherein said load field effect transistor includes a depletion-type field effect transistor, and said switching field effect transistors and said load current control field effect transistor includes an enhancement-type field effect transistor.

8. The load current control-type logic circuit of claim 7, wherein threshold voltages of said plurality of switching field effect transistors and said load current control field effect transistor are set to be approximately the same value.

9. The load current control-type logic circuit of claim 8, where said load is a resistance element.

10. The load current control-type logic circuit of claim 8, wherein said load is a field effect transistor including a source and gate connected to the gate of said load field effect transistor, and a drain connected to the source of said load field effect transistor.

11. The load current control-type logic circuit of claim 8, wherein said pull-down constant current source is a field effect transistor including a source and gate to which said second low potential is applied, and a drain connected to the respective cathodes of said diodes.

12. The load current control-type logic circuit of claim 11, wherein said field effect transistor forming said pull-down constant current source includes a depletion-type field effect transistor.

13. The load current control-type logic circuit of claim 12, wherein a threshold voltage of said load field effect transistor and that of a field effect transitor for the pull-down constant current source are set to be approximately the same value.

14. The load current control-type logic circuit of claim 8, wherein said pull-down constant current source includes a resistance element.

* * * * *